(12) United States Patent
Stepanian et al.

(10) Patent No.: US 7,078,359 B2
(45) Date of Patent: Jul. 18, 2006

(54) AEROGEL COMPOSITE WITH FIBROUS BATTING

(75) Inventors: Christopher J. Stepanian, Somerville, MA (US); George L. Gould, Mendon, MA (US); Redouane Begag, Hudson, MA (US)

(73) Assignee: Aspen Aerogels, Inc., Northborough, MA (US)

( * ) Notice: Subject to any disclaimer, the term of this patent is extended or adjusted under 35 U.S.C. 154(b) by 0 days.

(21) Appl. No.: 10/034,296

(22) Filed: Dec. 21, 2001

(65) Prior Publication Data

US 2002/0094426 A1    Jul. 18, 2002

Related U.S. Application Data

(60) Provisional application No. 60/257,437, filed on Dec. 22, 2000.

(51) Int. Cl.
*B32B 15/04* (2006.01)
*D04H 1/02* (2006.01)

(52) U.S. Cl. .................. 442/59; 442/172; 442/179; 442/327; 442/349; 501/12

(58) Field of Classification Search ............... 442/347, 442/417, 59, 172, 179, 327, 349; 428/292.1, 428/312.2, 317.9, 402; 501/12
See application file for complete search history.

(56) References Cited

U.S. PATENT DOCUMENTS

| 5,306,555 | A | * | 4/1994 | Ramamurthi et al. ......... 442/63 |
| 5,544,487 | A | * | 8/1996 | Attey et al. .................... 62/3.7 |
| 5,789,075 | A | | 8/1998 | Frank et al. |
| 5,972,254 | A | | 10/1999 | Sander |
| 5,973,015 | A | | 10/1999 | Coronado et al. |
| 6,068,882 | A | | 5/2000 | Ryu et al. |
| 6,087,407 | A | | 7/2000 | Coronado et al. |
| 2003/0077438 | A1 | * | 4/2003 | Frank et al. ................. 428/331 |

FOREIGN PATENT DOCUMENTS

JP          03213545 A  *  9/1991

OTHER PUBLICATIONS

"Wadding", Merriam-Webster Online, 2005.*
Translation of Japanese Publication JP 08-034678 (Sonoda et al.).*

* cited by examiner

*Primary Examiner*—Ula Ruddock
*Assistant Examiner*—Jennifer Boyd
(74) *Attorney, Agent, or Firm*—Townsend and Townsend and Crew LLP

(57) ABSTRACT

Aerogel composite materials having a lofty fibrous batting reinforcement preferably in combination with one or both of individual short randomly oriented microfibers and conductive layers exhibit improved performance in one or all of flexibility, drape, durability, resistance to sintering, x-y thermal conductivity, x-y electrical conductivity, RFI-EMI attenuation, and/or burn-through resistance.

51 Claims, 3 Drawing Sheets

AEROGEL COMPOSITE WITH FIBROUS BATTING

This application claims the benefit of U.S. Provisional Application No. 60/257,437 Dec. 22, 2000.

BACKGROUND OF THE INVENTION

The field of the present invention is aerogel composite materials. More particularly, this invention is directed to aerogel composites wherein the resulting composite exhibits improved performance as compared to prior aerogel composite products in one or more of the following qualities: reduced aerogel sintering; higher temperature performance; improved flexibility and drapeability; improved durability; decreased aerogel particle shedding; enhanced x-y plane thermal conductivity; enhanced x-y plane electrical conductivity; enhanced radio frequency interference (RFI) and/or electromagnetic interference (EMI) attenuation, enhanced infrared radiation (IR) suppression; and/or enhanced burn-through resistance. The fiber reinforcement is preferably a combination of a lofty fibrous structure (batting), individual randomly oriented short microfibers, and conductive layers. More particularly both fiber reinforcements are based upon either organic (e.g. thermoplastic polyester) or refractory (e.g. silica) fibers.

Insulating materials have been developed to solve a number of physical problems. Stiff polymeric foam and fiberglass insulating boards are well known as insulators for low and high temperature applications in fields such as refrigeration, building construction, and heating systems. Flexible battings such as those made from fiberglass have been used in applications that required flexibility, low density, and the ability to expand to fill a void space such as building construction. Aerogels, more specifically aerogel composites, were developed seeking to combine the strengths of both classes of materials.

Aerogels describe a class of material based upon their structure, namely low density, open cell structures, large surface areas (often 900 $m^2/g$ or higher) and sub-nanometer scale pore sizes. Supercritical and subcritical fluid extraction technologies are commonly used to extract the fluid from the fragile cells of the material. A variety of different aerogel compositions are known and may be inorganic or organic. Inorganic aerogels are generally based upon metal alkoxides and include materials such as silica, carbides, and alumina. Organic aerogels include carbon aerogels and polymeric aerogels such as polyimides.

Low density aerogels (0.02–0.2 g/cc) based upon silica are excellent insulators, better than the best rigid foams with thermal conductivities of 10 mW/m-K and below at 100° F. and atmospheric pressure. Aerogels function as thermal insulators primarily by minimizing conduction (low density, tortuous path for heat transfer through the nanostructures), convection (very small pore sizes minimize convection), and radiation (IR suppressing dopants may easily be dispersed throughout the aerogel matrix). Depending on the formulation, they can function well at temperatures of 550° C. and above. However, in a monolithic state they tend to be fragile and brittle and are thus not well suited for most applications outside of the laboratory.

U.S. Pat. No. 5,306,555 (Ramamurthi et al.) discloses an aerogel matrix composite of a bulk aerogel with fibers dispersed within the bulk aerogel and a method for preparing the aerogel matrix composite. The fibers may be long or short fibers of varying thicknesses, whiskers, mineral wool, glass wool, and even particles. The composition of the reinforcing material is an oxide such as $SiO_2$ and $Al_2O_3$ (fibers, whiskers, and wools) and carbon, metals, and a variety of oxides (particles). Preferred fibers are glass wool and rock wool. The fibers may be randomly distributed or oriented. They may also be in the form of individual fibers, bundles of fibers, mats or sheets, woven or unwoven. The aerogel matrix composite is substantially crack-free with substantially no volume shrinkage. The composites are formed by infiltrating fibrous pre-forms, either woven or non-woven, with gel precursors, followed by drying of the wet gel under supercritical conditions. The products can be obtained on the scale of about 3–7 hours, but suffer a major drawback of having a high elastic modulus, making the products quite stiff as manufactured. The Ramamurthi et al. articles improve in flexibility as they are utilized because they form cracks in the aerogel matrix domains. A second drawback is that the thermal conductivities of the aerogel matrix composites are also relatively high (18 to 21 mW/m-K at ambient conditions) compared to the preferred embodiments of this invention 8.6 to 14 mW/m-K at ambient conditions).

U.S. Pat. No. 5,789,075 (Frank et al.) appears to describe the same structure as Ramamurthi et al. after the Ramamurthi et al. structure is removed from its mold, except that the Frank et al. composite is intentionally cracked in a controlled manner. The controlled cracking is said to give additional flexibility to the resulting composite. Suitable fibers are individual fibers randomly or ordered, preferably at least 1 cm in length. The fibers may also be used in the form of a web or mat. A plurality of webs or mats can be superposed upon one another. In the case of a layered arrangement of mats, a change in the direction from one layer to the next is deemed advantageous. Although the Description and Claims disclose a manufacturing process which includes step (b) "adding fibers to the sol," the Examples only show the addition of a non-fiber-containing sol to a polyester or glass fiber web. Individual randomly distributed fibers are not used in combination with a fibrous web.

U.S. Pat. No. 5,972,254 (Sander) is directed to ultra-thin pre-stressed fiber reinforced aerogel honeycomb catalyst monoliths. Thin panels or monoliths of aerogels, xerogels, zeolites, and other low density material are reinforced with pre-stressed fibers in two of three dimensions. A mixture of metal alkoxides, water, and a catalyst are poured into a gas permeable mold containing pre-tensioned reinforcing fibers running perpendicular to each other at defined intervals, followed by polymerization and supercritical drying.

U.S. Pat. Nos. 5,973,015 and 6,087,407 (Coronado, et al.) describe aerogel composites made from organic precursors, e.g. formaldehyde, which infiltrate a fiber pre-form. The resultant composite is said to have mechanical stability. The re-inforcing fibers described in the figures run lengthwise and are shown to be planar structures in the figures. The products suffer from relatively low thermal stability in air under high heat loads as well as insufficient flexibility for many uses.

U.S. Pat. No. 6,068,882 (Ryu et al.) disclose aerogel composite materials previously manufactured and sold by Aspen Systems, Inc. The aerogel contents of the product were an aerogel powder rather than an aerogel monolith. Thus flexure of the product resulted in the shedding of significant quantities of the powder. The thermal performance was significantly degraded as compared to aerogel monolith alone. The prior products were stiff and readily fractured or fragmented.

Thus the prior aerogel composite materials have not been suitable for many uses due to one or more of: low flexibility, low durability, excessive aerogel sintering when exposed to heat, less than ideal thermal conductivity, insufficient x-y thermal and/or electrical conductivity, poor RFI-EMI attenuation, and/or insufficient burn-through resistance.

The present invention arose from research directed to resolving these problems. Accordingly, it is an object of the present invention to produce an improved aerogel composite structure which exhibits one or more of the following qualities: low sintering/higher temperature performance; improved flexibility, exceptionally low thermal conductivity, drapeability, or conformability; enhanced x-y thermal and/or electrical conductivity; enhanced RFI-EMI attenuation; and/or enhanced burn-through resistance.

SUMMARY OF THE INVENTION

This invention is directed to an aerogel composite which exhibits improved performance over prior aerogel composites in one or more of the areas of flexibility, durability, aerogel sintering, x-y thermal and/or electrical conductivity, RFI and EMI attenuation, and burn-through resistance.

More specifically, the invention is directed to a composite having two parts, namely reinforcing fibers and an aerogel matrix wherein the reinforcing fibers are in the form of a lofty fibrous structure (i.e. batting), preferably based upon either thermoplastic polyester or silica fibers, and more preferably in combination with individual randomly distributed short fibers (microfibers). The use of the lofty batting reinforcement minimizes the volume of unsupported aerogel while generally improving the thermal performance of the aerogel, rather than degrading it as in the prior art. Moreover, when an aerogel matrix is reinforced by a lofty batting material, particularly a continuous non-woven batting comprised of very low denier fibers, the resulting composite material at least maintains the thermal properties of a monolithic aerogel in highly flexible, drapeable form, making the composite suitable, for instance, for clothing applications.

Under very high heat loads, such as those generated by direct surface impingement of a gas/oxygen torch flame, monolithic aerogels can rapidly sinter and shrink within seconds. When the aerogels are reinforced by the combination of the lofty fibrous batting and microfibers, as in one embodiment of this invention, the rate of shrinkage, sintering, and ultimate failure of the insulation structure can be delayed by one or more orders of magnitude time, i.e. increasing burn through from seconds to hours.

Still more specifically, an aerogel composite further including a thermally conductive layer has been found helpful in improving the thermal performance of the composite. For example, carbon fiber cloth or two orthogonal plies of unidirectional carbon fiber placed at the center of a composite provide a thermal breakthrough barrier under a high heat load, a high degree of IR opacification, and a thermally dissipative layer structure that will spread the heat out in the x-y plane of the composite. More specifically, the thermally conductive layer in the middle, through the thickness, of the aerogel composite can be selected to have a minimal effect on the stiffness of the composite. Moreover, if desired the layer can have malleability or intrinsic conformability so that the resulting aerogel composite will be conformable, e.g. a copper wire mesh placed at the interlayer of the aerogel composite article confers conformability and deformability when the composite is bent. In addition, the conductive mesh also provides RFI and EMI resistance.

These and still further embodiments of the present invention are described in greater detail below.

DESCRIPTION OF THE PREFERRED EMBODIMENTS

Aerogels are a class of materials formed by removing a mobile interstitial solvent phase from the pores of a gel structure supported by an open-celled polymeric material at a temperature and pressure above the solvent critical point. By keeping the solvent phase above the critical pressure and temperature during the entire solvent extraction process, strong capillary forces generated by liquid evaporation from very small pores that cause shrinkage and pore collapse are not realized. Aerogels typically have low bulk densities (about 0.15 g/cc or less, preferably about 0.03 to 0.3 g/cc), very high surface areas (generally from about 400 to 1,000 $m^2/g$ and higher, preferably about 700 to 1000 $m^2/g$), high porosity (about 95% and greater, preferably greater than about 97%), and relatively large pore volume (more than about 3.8 mL/g, preferably about 3.9 mL/g and higher). The combination of these properties in an amorphous structure gives the lowest thermal conductivity values (9 to 16 mW/m-K at 37° C. and 1 atmosphere of pressure) for any coherent solid material.

One of the most attractive uses for aerogels is for passive insulation bodies to maintain either a constant temperature or a significant delta temperature between an object and its surroundings at the lowest possible energy cost. Monolithic aerogel structures normally have minimal flexibility before failure (e.g. flexural modulus of 0.5 MPa at a density of 0.1 g/cc for silica aerogel monolith).

The aerogel composite material of the present invention comprises two phases. The first is a low-density aerogel matrix and the second is a reinforcing phase. This reinforcing phase consists primarily of a lofty fibrous material, preferably a combination of the lofty batting and one or more fibrous materials of significantly different thickness, length, and/or aspect ratio. A preferred combination of a two fibrous material system is produced when a short, high aspect ratio microfiber (one fibrous material) dispersed throughout an aerogel matrix that penetrates a continuous lofty fiber batting (the second fibrous material).

Figure 1:
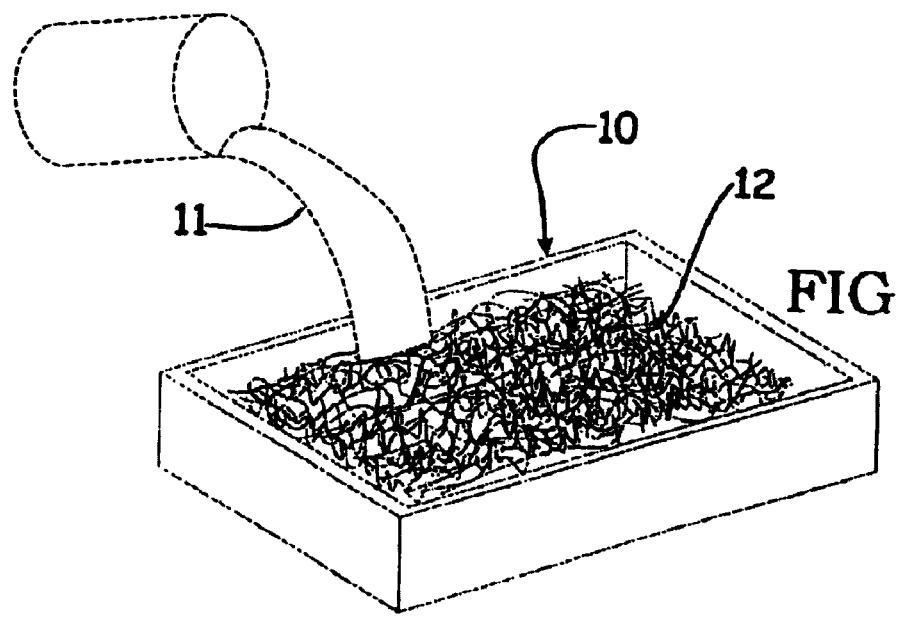
FIG. 1 illustrates a general fabrication process of the present invention.
Figure 2:
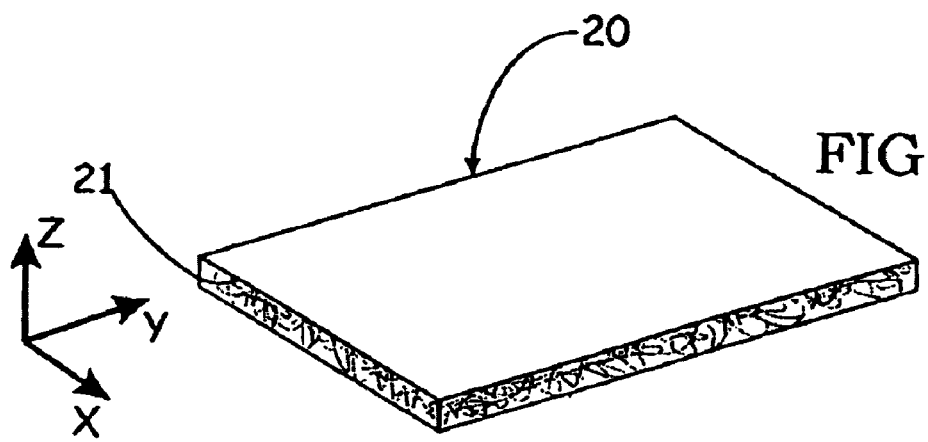
FIG. 2 is a view of an aerogel composite of the present invention.
Figure 3:
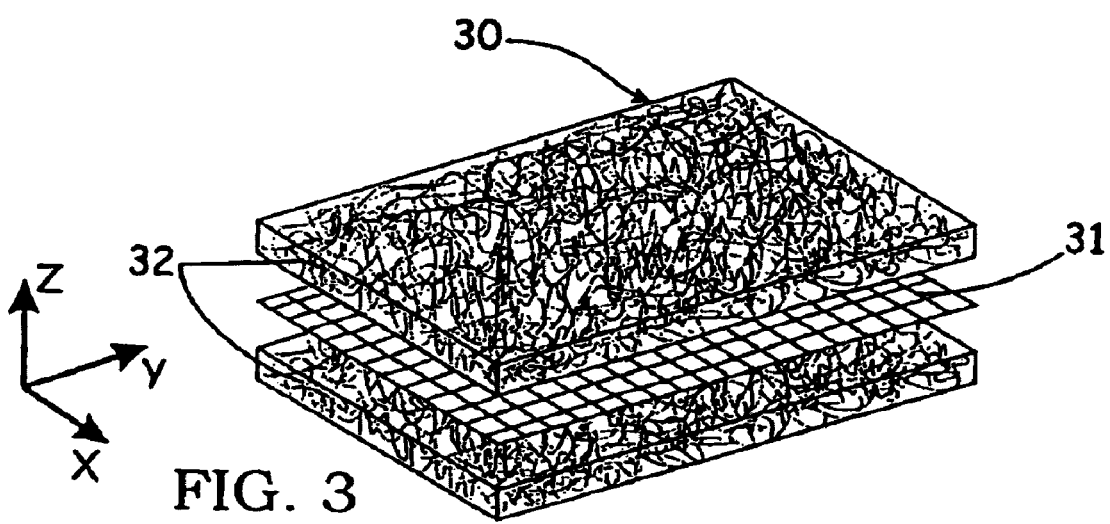
FIG. 3 is an exploded view of a 3 layer laminate useful as a reinforcement material in the present invention.

The present invention can be seen via FIGS. 1–6. FIG. 1 illustrates the fabrication process of the present invention wherein a gel precursor 11 is added to a reinforcing batting 12 in some constraining mold type structure 10. FIG. 2 shows an aerogel composite 20 of the present invention formed with an inorganic or organic batting 21 and an aerogel matrix. FIG. 3 shows a gel precursor mixed with microfiber material being cast into a continuous lofty fiber batting material to generate the composite illustrated in FIG. 4.

The aerogel matrix of the present invention may be organic, inorganic, or a mixture thereof. The wet gels used to prepare the aerogels may be prepared by any of the gel-forming techniques that are well-known to those trained in the art: examples include adjusting the pH and/or temperature of a dilute metal oxide sol to a point where gelation occurs (R. K. Iler, *Colloid Chemistry of Silica and Silicates*, 1954, chapter 6; R. K. Iler, *The Chemistry of Silica*, 1979, chapter 5, C. J. Brinker and G. W. Scherer, *Sol-Gel Science*, 1990, chapters 2 and 3). Suitable materials for forming inorganic aerogels are oxides of most of the metals that can form oxides, such as silicon, aluminum, titanium, zirconium, hafnium, yttrium, vanadium, and the like. Particularly preferred are gels formed primarily from alcohol solutions of hydrolyzed silicate esters due to their ready availability and low cost (alcogel).

It is also well known to those trained in the art that organic aerogels can be made from polyacrylates, polystyrenes, polyacrylonitriles, polyurethanes, polyimides, polyfurfural alcohol, phenol furfuryl alcohol, melamine formaldehydes, resorcinol formaldehydes, cresol formaldehyde, phenol formaldehyde, polyvinyl alcohol dialdehyde, polycyanurates, polyacrylamides, various epoxies, agar, agarose, and the like (see for instance C. S. Ashley, C. J. Brinker and D. M. Smith, *Journal of Non-Crystalline Solids*, volume 285, 2001). However, as insulating articles at high temperatures in oxygen-containing atmospheres, these materials can burn away and are thus not preferred for this invention.

For the sake of convenience the alcogel route of forming inorganic aerogels is used below to illustrate the invention, though this is not intended to limit the present invention to any specific type of aerogel and/or method of preparation. The invention is applicable to other aerogels and preparation methods.

Generally the principal synthetic route for the formation of an inorganic aerogel is the hydrolysis and condensation of an appropriate metal alkoxide. The most suitable metal alkoxides are those having about 1 to 6 carbon atoms, preferably from 1–4 carbon atoms, in each alkyl group. Specific examples of such compounds include tetraethoxysilane (TEOS), tetramethoxysilane (TMOS), tetra-n-propoxysilane, aluminum isopropoxide, aluminum sec-butoxide, cerium isopropoxide, hafnium tert-butoxide, magnesium aluminum isopropoxide, yttrium isopropoxide, titanium isopropoxide, zirconium isopropoxide, and the like. In the case of silica precursors, these materials can be partially hydrolyzed and stabilized at low pH as polymers of polysilicic acid esters such as polydiethoxysiloxane (PDEOS). These materials are commercially available in alcohol solution (for example Silbond® 40, 40% silica content, Silbond Corporation). Pre-polymerized silica precursors are especially preferred for the aerogel composite articles of this invention.

Suitable materials for use in forming the aerogels to be used at low temperatures are the non-refractory metal alkoxides based on oxide-forming metals. Preferred such metals are silicon and magnesium as well as mixtures thereof. For higher temperature applications, suitable alkoxides are generally refractory metal alkoxides that will form oxides, e.g. such as zirconia, yttria, hafnia, alumina, titania, ceria, and the like, as well as mixtures thereof such as zirconia and yttria. Mixtures of non-refractory metals with refractory metals, such as silicon and/or magnesium with aluminum, may also be used. An advantage of using more than one metal oxide matrix material for the aerogel structure is an enhancement of IR opacification, achieved by providing chemical functional groups that absorb radiation at a wider range of wavelengths.

Finely dispersed dopants, such as carbon black, titania, iron oxides, silicon carbide, molybdenum silicide, manganese oxides, polydialkylsiloxanes wherein the alkyl groups contain 1 to 4 carbon atoms, and the like, may be added to improve thermal performance at higher temperatures by increasing the opacity of the article to IR transmission. Suitable amounts of such dopants generally range from about 1 to 20% by weight of the finished composite, preferably about 2 to 10%.

Major variables in the inorganic aerogel formation process include the type of alkoxide, solution pH, and alkoxide/alcohol/water ratio. Control of the variables can permit control of the growth and aggregation of the matrix species throughout the transition from the "sol" state to the "gel" state. While properties of the resulting aerogels are strongly affected by the pH of the precursor solution and the molar ratio of the reactants, any pH and any molar ratio that permits the formation of gels may be used in the present invention.

Generally, the solvent will be a lower alcohol, i.e. an alcohol having 1 to 6 carbon atoms, preferably 2 to 4, although other liquids can be used as is known in the art. Examples of other useful liquids include but are not limited to: ethyl acetate, ethyl acetoacetate, acetone, dichloromethane, and the like.

Alternatively, any of the following methods can be utilized to make an aerogel composite article of this invention, but the methods that allow for obtaining the lowest density and/or best thermally insulating articles are preferred. For example, in a first alternative implementation of gel making, a water soluble, basic metal oxide precursor can be gelled by acidification in water to make a hydrogel. Sodium silicate has been widely used for this purpose. Salt by-products may be removed from the silicic acid precursor by ion-exchange and/or by washing subsequently formed gels with water. Removing the water from the pores of the gel can be performed via exchange with a polar organic solvent such as ethanol, methanol, or acetone. The resulting dried aerogel has a structure similar to that directly formed by supercritical extraction of gels made in the same organic solvent. A second alternative method entails reducing the damaging capillary pressure forces at the solvent/pore interface by chemical modification of the matrix materials in their wet gel state via conversion of surface hydroxyl groups to tri-methylsilylethers (see U.S. Pat. No. 5,877,100 for example) to allow for drying of the aerogel materials at temperatures and pressures below the critical point of the solvent.

For silica aerogel containing low temperature insulation, the currently preferred ingredients are tetraethoxysilane (TEOS), water, and ethanol (EtOH). The preferred ratio of TEOS to water is about 0.2–0.5:1, the preferred ratio of TEOS to EtOH is about 0.02–0.5:1, and the preferred pH is about 2 to 9. The natural pH of a solution of the ingredients is about 5. While any acid may be used to obtain a lower pH solution, HCl, $H_2SO_4$ or HF are currently the preferred acids. To generate a higher pH, $NH_4OH$ is the preferred base.

For the purposes of this patent, a lofty batting is defined as a fibrous material that shows the properties of bulk and some resilience (with or without full bulk recovery). The preferred form is a soft web of this material. The use of a lofty batting reinforcement material minimizes the volume of unsupported aerogel while avoiding substantial degradation of the thermal performance of the aerogel. Batting preferably refers to layers or sheets of a fibrous material, commonly used for lining quilts or for stuffing or packaging or as a blanket of thermal insulation.

The reinforcing fibrous material used in the present invention is one or more layers of a lofty fibrous batting. The use of a lofty batting reinforcement minimizes the volume of unsupported aerogel while avoiding substantial degradation of the thermal performance of the aerogel. While generally a "batting" is a product resulting from carding or Garnetting fiber to form a soft web of fiber in sheet form, for purposes of this invention "batting" also includes webs in non-sheet form, e.g. the Primaloft® products from Albany International, provided that they are sufficiently open to be "lofty." Batting commonly refers to a fibrous material commonly used for lining quilts or for stuffing or packaging or as a blanket of thermal insulation. Suitable fibers for producing the batting are relatively fine, generally having deniers of 15 and below, preferably 10 and below. The softness of the web is a byproduct of the relatively fine, multi-directionally oriented fibers that are used to make the fiber web.

A batting is "lofty" for purposes of this invention if it contains sufficiently few individual filaments (or fibers) that it does not significantly alter the thermal properties of the reinforced composite as compared to a non-reinforced aerogel body of the same material. Generally this will mean that upon looking at a cross-section of a final aerogel composite, the cross-sectional area of the fibers is less than 10% of the total surface area of that cross section, preferably less than 8%, and most preferably less than 5%. The lofty batting preferably has a thermal conductivity of 50 mW/m-K, or less at room temperature and pressure to facilitate the formation of low thermal conductivity aerogel composites.

Another way of determining if a batting is sufficiently lofty to be within the scope of this invention is to evaluate its compressibility and resilience. In this case a lofty batting is one that (i) is compressible by at least 50% of its natural thickness, preferably at least 65%, and most preferably at least 80%, and (ii) is sufficiently resilient that after compression for a few seconds it will return to at least 70% of its original thickness, preferably at least 75%, and most preferably at least 80%. By this definition a lofty batting is one that can be compressed to remove the air (bulk) yet spring back to substantially its original size and shape. For example a Holofil™ batting may be compressed from its original 1.5" thickness to a minimum of about 0.2" and spring back to its original thickness once the load is removed. This batting can be considered to contain 1.3" of air (bulk) and 0.2" of fiber. It is compressible by 87% and returns to essentially 100% of its original thickness. Fiberglass batting used for home insulation may be compressed to a similar extent and springs back to about 80% of its original thickness, but does that quite slowly.

The batting useful herein is substantially different from a fibrous mat. A fibrous mat is "a densely woven or thickly tangled mass," i.e. dense and relatively stiff fibrous structures with minimal open space between adjacent fibers, if any. While a mat generally has a density of greater than 25 lbs/ft$^3$ (0.41 g/cc), a lofty batting useful herein has a much lower density, i.e. in the range of about 0.1 to 16 lbs/ft$^3$ (0.001–0.26 g/cc), preferably about 2.4 to 6.1 lbs/ft$^3$ (0.04 to 0.1 g/cc). Generally, mats are compressible by less than about 20% and show little to no resilience. In an aerogel composite prepared with a mat reinforcement, the cross sectional surface area of the mat fibers is about 30 to 50% of the total surface area of the cross section.

Preferably the batting retains at least 50% of its thickness after the gel forming liquid is poured in.

A way of understanding the need for openness in the fiber reinforcing material used herein is to recognize that fiber reinforcements that tend to run along the z axis, (in the direction of the heat flow) will significantly increase the thermal conductivity of the resulting composite by acting as thermal conduits. A batting that has highly aligned (straight) fibers, particularly in the x-y horizontal plane is stiffer than a typical lofty batting of the same density with bent or crimped fibers running in all three axes. In order to minimize heat flow in the z direction (as is the desire with most insulating materials) the batting should have low heat flow along the z axis (in the direction of the heat flow). Thus a suitable batting has a high enough quantity of fibers oriented along the z axis to maintain loft, yet not so great a quantity that the insulating properties of the resulting composite are compromised by these fibers. The fibers along the z axis may be of a different material (preferably one with lower thermal conductivity) than those in the x and y axes. The z axis fibers may also be made more circuitous, so that they present a more tortuous path for heat conduction than do the fibers in the x-y direction. The same fiber materials and methods may be used throughout the batting in an attempt to minimize thermal conduction in all axes, but in many insulating applications, however, it is heat flow in a specific direction that is being addressed, and using such materials and methods may compromise the flexibility of the resulting composite. The ideal lofty batting is one with fine, crimped fibers, evenly dispersed throughout the composite.

While the composite produced with a lofty batting is flexible, durable, has a low thermal conductivity and has a good resistance to sintering, the performance of the aerogel composite may be substantially enhanced by incorporating randomly distributer microfibers into the composite, particularly microfibers that will help resist sintering while increasing durability and decreasing dusting. The effect of short fiber reinforcement (microfiber) on the performance of a composite will depend on a number of variables, such as fiber alignment, diameter, length, aspect ratio (fiber length/fiber diameter), strength, modulus, strain to failure, coefficient of thermal expansion, and the strength of the interface between the fiber and the matrix. The microfibers are incorporated into the composite by dispersing them in the gel precursor liquid and then using that liquid to infiltrate the lofty batting.

Suitable microfibers useful herein typically range from 0.1 to 100 μm in diameter, have high aspect ratios (L/d>5, preferably L/d>100), and are relatively uniformly distributed throughout the composite. Since higher aspect ratios improve composite performance, the longest microfibers possible are desired. However, the length of the fibers used herein is constrained to avoid (or at least minimize) any filtration by the chosen lofty batting has when a microfiber-containing gel precursor is infused into the batting. The microfibers should be short enough to minimize filtration by the lofty batting and long enough to have the maximum possible effect on the thermal and mechanical performance of the resulting composite. The microfibers preferably have a thermal conductivity of 200 mW/m-K or less to facilitate the formation of low thermal conductivity aerogel composites.

When the microfibers are dispersed in a sol, they often will rapidly settle. To overcome this problem, a suspension or dispersion agent that will not deleteriously effect the gel formation should be added to the sol. Suitable suspension/dispersion agents include solutions of high molecular weight block copolymers with pigment affinic groups (Disperbyk-184 and 192 from BYK-Chemie), and the like. The agents need to be effective during at least the period of time between the dispersion of the microfiber in the gel precursor and the gelation of the sol.

The quantity, type, and/or size and aspect ratio of the microfibers used within a specific aerogel composite may be varied to meet specific tasks. For example, an application may involve insulating regions of different temperatures using a continuous aerogel composite; the composite may be made such that more microfibers will be present in the areas of the composite that will contact the higher temperature regions. Similarly, different microfibers (e.g. different material, different aspect ratio, size) may be incorporated in such areas for best insulation performance. Such microfiber modification may be accomplished by using a variety of suspension agents and/or microfibers to cause the microfibers to settle into the composite at different rates and thus in different locations.

Suitable fibrous materials for forming both the lofty batting and the microfibers include any fiber-forming material. Particularly suitable materials include: fiberglass, quartz, polyester (PET), polyethylene, polypropylene, polybenzimidazole (PBI), polyphenylenebenzo-bisoxasole (PBO), polyetherether ketone (PEEK), polyarylate, polyacrylate, polytetrafluoroethylene (PTFE), poly-metaphenylene diamine (Nomex), poly-paraphenylene terephthalamide (Kevlar), ultra high molecular weight polyethylene (UHMWPE) e.g. Spectra™, novoloid resins (Kynol), polyacrylonitrile (PAN), PAN/carbon, and carbon fibers.

While the same fibrous material may be used in both the batting and the microfibers, a combination of different materials may be utilized. One such combination is a lofty fiberglass batting with carbon microfibers distributed throughout.

Figure 5:
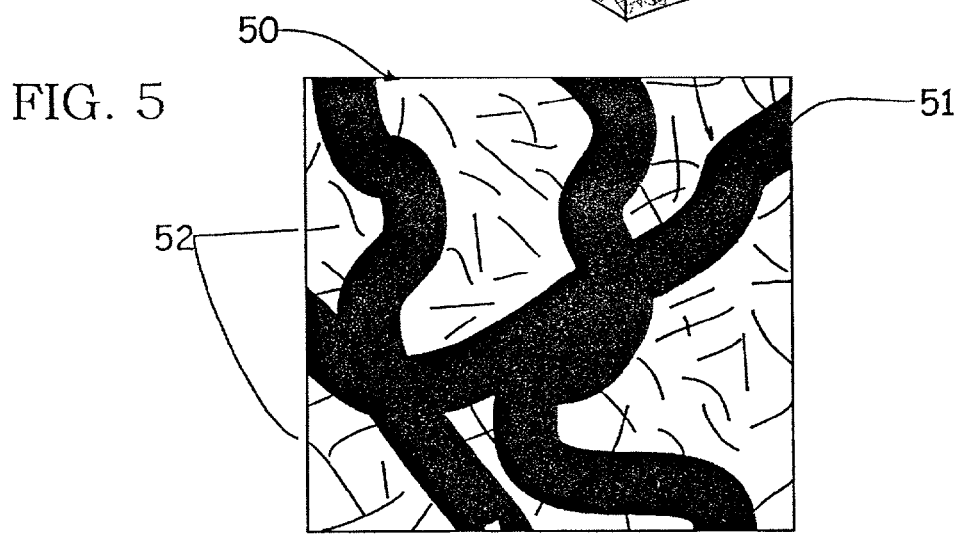
FIG. 5 is an exploded partial view of an aerogel composite showing the composite reinforced both on a macro level with a fiber batting and on a micro level with individual filaments.

As indicated the combination of batting and microfiber reinforcement has been found to enhance sintering resistance. This may be accomplished by incorporating microfibers of a suitable material, e.g. carbon filaments, within the gel precursor (generally in combination with a suitable non-reactive dispersing agent) prior to pouring the gel precursor onto the fibrous batting. FIG. 5 is an exploded view of such an aerogel composite where the composite is reinforced on both a macro level with a fibrous batting 51 and on a micro level with carbon fiber filaments 52. When dispersed in a silica matrix, carbon microfibers provide a combination of IR opacification and microscale strengthening that give a non-refractory metal oxide such as silica greatly improved thermal and mechanical performance at higher temperatures relative to non-strengthened and opacified silica.

Figure 4:
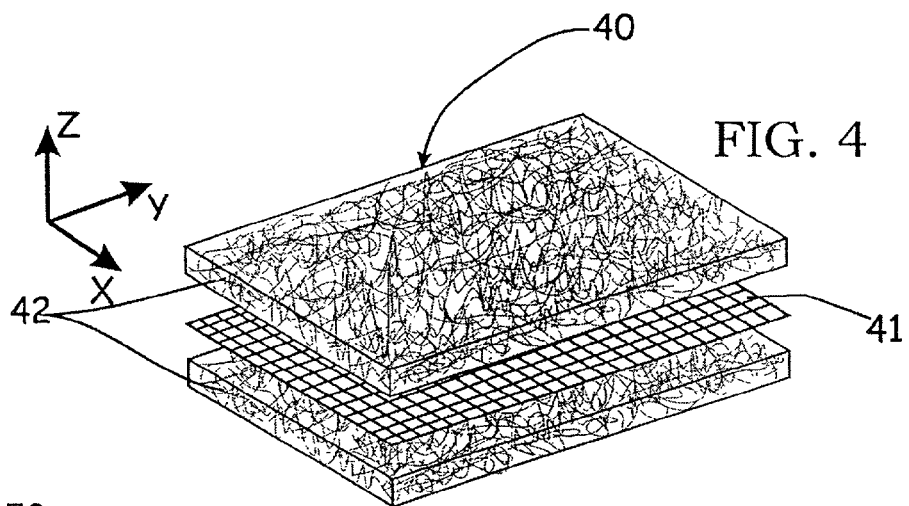
FIG. 4 is an exploded view of an alternative 3 layer laminate useful as a reinforcement material in the present invention.
Figure 6:
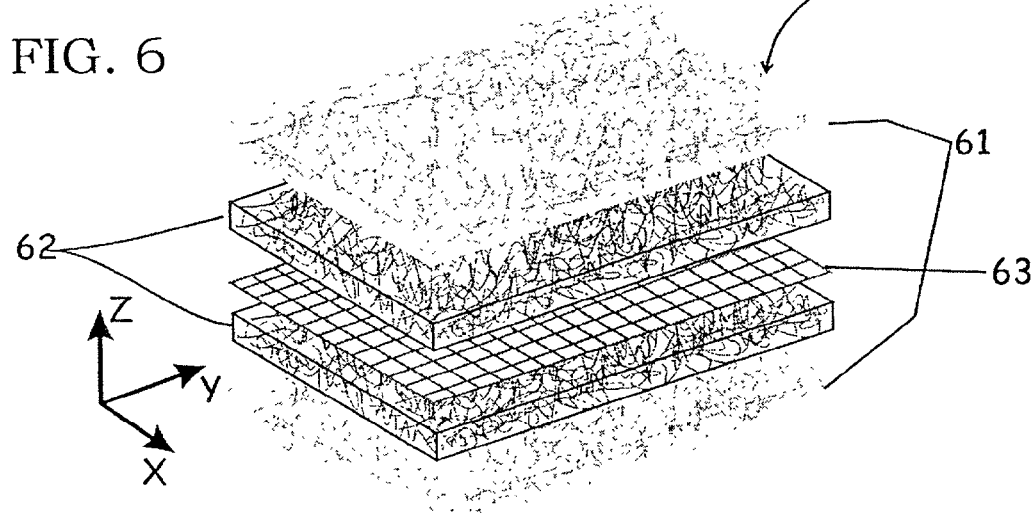
FIG. 6 is an exploded view of an alternative 5 layer laminate useful in the present invention.

In another embodiment of this invention, the lofty reinforcing fibrous batting is used in the form of a multi-layer laminate as shown in FIGS. 3, 4, and 6. In addition to including fibrous material batting, the laminates may include layers of materials which will help provide specific characteristics to the final composite structure. For example, the inclusion of a metal layer in the x-y plane, such as a copper mesh, can improve x-y thermal and/or electrical conductivity, RFI-EMI attenuation, the ability to anchor the composite to a support structure, and/or provide additional physical strength. While any metal can be used to produce the metal mesh, copper and stainless steel are currently preferred. Suitable meshes will be made from wires having diameters ranging from about 0.001 to 0.1 inches, preferably about 0.01 to 0.05, and the wire spacing may range from as tight as a window screen to 0.3 inches.

When the additional layer is of a high (>1 W/m-K) thermal conductivity material such as a carbon fiber, silicon carbide, or a metal, the resulting composite has been found to exhibit a significantly enhanced ability to rapidly dissipate heat throughout the x-y plane of a multilayer composite, further improving the durability of the composite under a high heat load.

FIG. 3 shows a 3 layer laminate consisting of a layer of lofty fiber batting 32, a fine copper mesh 31, and a second layer of lofty fiber batting 32. FIG. 4 shows another 3 layer laminate of a layer of lofty fiber batting 42, a woven carbon fiber textile 41, and a second layer of fiber batting 42. While these laminates are shown to be symmetric, this is preferred and not mandatory.

When a metal mesh is used as one or more of the central layers, it also offers the benefit of producing an aerogel composite material which is not only drapeable or flexible, but is also conformable, i.e. it can retain its shape after bending.

Other approaches to couple the high conductivity layer into the composite include metal sheet where portions of the sheet are cut and bent out of plane. These bent portions serve as an anchor between the conductive layer and the rest of the composite. Metal foil strips may be similarly utilized, as may a combination of such materials.

The conductive layer has a number of secondary benefits. Aerogel composites containing metal conductive layers, may be deformed to conform to a shape and hold that shape. The composite of FIG. 3 can be deformed to both simple and complex curvatures. It can spring back to a limited extent but also effectively plastically deformed to hold a shape. Another benefit of the conductive layer is that it commonly consists of structural fibers—strong and continuous. This conductive layer can serve as an anchoring material through which mechanical fasteners may be driven. The fasteners would grip onto composite or the conductive layer itself.

Mechanical loads experienced by the composite can be transmitted through a metal conductive layer to the fastener and into other structures. An example of this would be fastening the aerogel composite onto a vehicle chassis to serve as a heat barrier. If the reinforcement is adequately magnetized, it may be attached to a ferrous or magnetic structure without the need of mechanical fasteners. The heat transmitted by the conductive layer can be either dumped to the environment and/or a beat sink (radiation, convection) or used to run secondary processes. For example, excess heat may be used directly (heating water, etc.) or converted into electrical energy through a Peltier element or the like. The design of the aerogel composite can be such that the hot side of the blanket has a conductive layer near the surface that directs heat flux to the cold side of the blanket only at points where Peltier elements are placed. Examples of high thermal conductivity fibers include graphite, silicon carbide, copper, stainless steel, aluminum, and the like.

FIG. 6 is an exploded view of a laminate consisting of a layer of fiber batting 61, a layer of silicon carbide felt 62, a fine copper mesh 63, a layer of silicon carbide felt 62, and a layer of fiber batting 61.

After identification of the aerogel to be prepared, a suitable metal alkoxide-alcohol solution is prepared. The preparation of aerogel-forming solutions is well known in the art. See, for example, S. J. Teichner et al, *Inorganic*

Oxide Aerogel, *Advances in Colloid and Interface Science*, Vol. 5, 1976, pp 245–273, and L. D. LeMay, et al., *Low-Density Microcellular Materials*, MRS Bulletin, Vol. 15, 1990, p 19.

While a single alkoxide-alcohol solution is generally used, a combination of two or more alkoxide-alcohol solutions may be used to fabricate mixed oxide aerogels. After formation of the alkoxide-alcohol solution, water is added to cause hydrolysis so that a metal hydroxide in a "sol" state is present. The hydrolysis reaction, using tetra-ethoxysilane as an example, is:

$$Si(OC_2H_5)_4 + 4H_2O \rightarrow Si(OH)_4 + 4(C_2H_5OH) \tag{1}$$

To form an aerogel monolith, this sol state alkoxide solution is then aged for a sufficiently long period (commonly overnight) so that a condensation reaction (as shown in Eq. 2) occurs and forms precursors which after supercritical drying become aerogels.

$$Si(OH)_4 \rightarrow SiO_2 + 2H_2O \tag{2}$$

Further details and explanation of the present invention may be found in the following specific examples, which describe the manufacture of aerogel composites in accordance with the present invention and test results generated there from. All parts and percents are by weight unless otherwise specified.

EXAMPLE 1

A section (2'×3'×¼") of polyester Thinsulate® Lite Loft insulation from 3M Company was placed in a walled container. 1300 ml of a commercially available pre-hydrolyzed silica precursor (Silbond H-5) is mixed with 1700 ml of denatured alcohol, 95%. The solution is stirred for 15 min. The solution is then gelled by the slow addition of HF (2% by volume of the total solution) with stirring. The resulting solution is poured on the blanket previously placed in a container. Gelation occurs within a few minutes. The fresh "blanket-gel" is aged overnight in a sealed bath of ethanol at 50° C. The alcohol trapped in the gel is removed by subcritical and supercritical $CO_2$ extraction over the span of four days.

The resulting aerogel composite has a density of approximately 0.1 g/cc. The thermal conductivity of the aerogel composite was determined by a Thin Heater Thermal Conductivity Test (ASTM C 1114-98) to be 16.6 mW/m° K. A pure aerogel monolith prepared using the same source materials and manufacturing process had a thermal conductivity of 17.4 mW/m° K.

The aerogel composite is extremely flexible. It can be draped over a person's arm without macroscopic failure. This "drape test" is the equivalent of approximately a 2" radius of curvature, 180° bend.

The blanket shows a significant resistance to heat transfer and thermal degradation/sintering when subjected to propane, a combination of liquefied petroleum and methylacetylene-propadiene (MAPP) gas, and oxyacetylene torch flames. If the blanket is subjected to the heat from the flame on one side, the other side can be touched by bare skin without damage. The poly-ester batting alone degrades rapidly when exposed to direct flame. The polyester batting reinforced aerogel composite resists thermal degradation of the polyester to a much greater degree (instantaneous vs. approximately 40 seconds for burn-through for a ¼" thick sample subjected to a propane torch flame). As long as the polyester remains in the aerogel matrix, the composite remains flexible and has a low degree of thermal conductivity. Burn-through will occur if the flame is placed too close to the aerogel composite.

EXAMPLE 2

The procedure of Example 1 is repeated except that the polyester fiber batting was replaced by a lofty silica fiber structure (Quartzel from Saint-Gobain Quartz) having a density of 65 g/m² with a polyvinylalcohol binder.

The resulting silica batting/silica aerogel composite has a thermal conductivity of 15.0 mW/m-K as tested on a guarded hotplate (ASTM C-177). The flexibility of the composite is less than that of the aerogel-polyester blanket of Example 1, but still significant. It is quite flexible but does not drape to the same extent. The density of the aerogel composite was 0.113 g/cc. The thickness of the composite was approximately 3 mm. This composite resists thermal degradation when exposed to open flame much better than the product of Example 1.

Aerogel sintering appears to be minimized by the presence of the fiber. An oxyacetylene torch is placed 5–6" below the sample with the top of the flame impinging on the bottom of the blanket. Minimal sintering is seen on the bottom surface of the sample after 5 hours of exposure. The top of the sample could be touched with a bare hand during the test. The temperature on the top of the aerogel composite varies from 150–230° C. based upon the distance between the blanket and the flame source. The bottom of the blanket glows orange-yellow. A single pyrometer reading taken from the yellow section of the blanket bottom yields a temperature of 1100° C.

EXAMPLE 3

The procedure of Examples 1 and 2 is repeated except that the reinforcement fiber batting is replaced by a 5 layer fiber laminate of polyester/silicon carbide/-16 copper mesh/silicon carbide/polyester).

The thermal conductivity (tested per ASTM C-177) is 12.5 mW/m-K (average). The composite is not very flexible. The thickness of the laminate is 10.3 mm. The copper mesh improves the x-y thermal conductivity by spreading out point loads over a larger area. The copper mesh also provides an EMI-RFI shield. Aerogel sintering appears to be minimized by the presence of the reinforcing polyester and silicon carbide fibers.

EXAMPLE 4

The procedure of Example 3 is repeated except that the reinforcement consists of a 4 layer laminate of polyester batting, uni-directional carbon fiber with a polymeric binder, light copper mesh, and a lofty polyester batting.

The thermal conductivity (tested per ASTM C-177) is 14.1 mW/m-K (average). The composite has little flexibility. The thickness of the laminate is 8.0 mm. Aerogel sintering is minimized by the presence of the reinforcing fibers.

EXAMPLE 5

The procedure of Example 3 is repeated except that the reinforcement consists of a 3 layer laminate of silica felt, stainless steel mesh, and silica felt, about 6" on a side. A second reinforced aerogel composite where a copper mesh is substituted for the stainless steel is also prepared.

The thermal conductivity (tested per ASTM C-177) is 12.4 mW/m-K (average). The composite is somewhat flexible and is conformable in that it retains the shape into which it is bent. The thickness of the laminate is 5.3 mm. Aerogel sintering appears to be minimized by the presence of the reinforcing fibers in a flame test using an oxyacetylene torch set at a 6" distance from the bottom of the composite and giving approximately a 2 inch diameter impingement area (glowing red-orange). The temperature is 120° C. at the edge of the composite (thermocouple attached to the steel mesh through the top), while more than two inches away from the center of the impingement (though still directly over the flame) the temperature measures 60° C. at steady state conditions.

The aerogel composite with the copper mesh substituted for the stainless steel mesh shows the same effect.

EXAMPLE 6

The procedure of Example 2 is repeated except that two additional ingredients are added to the silica sol. The first is a low denier carbon fiber (Pyrograf III, Grade PR-11-AG from Pyrograf Products, Zenia, Ohio. The second is a dispersion agent (Disperbyk 184 from BYK-Chemie). Two grams of carbon fiber and six grams of dispersion agent are added to 750 ml of ethanol in a 1000 ml beaker. The beaker is placed in an ice bath and sonicated at full power by a Misonix 2020 sonicator for one hour to break up fiber clumps and form a suspension that is visibly stable for at least an hour. When a drop of the suspension is placed on a glass slide and allowed to sheet the fibers do not rapidly clump.

The resulting silica batting/carbon fiber/silica aerogel composite has a thermal conductivity of 14.8 mW/m-K (ASTM C-177). The flexibility of the composite is slightly less than that of the aerogel blanket of Example 2 (Blanket # 2), but still significant. The aerogel matrix tends to crack in a macroscopic fashion when strained. The density of the aerogel composite is approximately 0.12 g/cc. The thickness of the composite is approximately 3 mm.

This composite material resists thermal degradation when exposed to open flame much better than the aerogel blanket of Example 2.

A MAPP gas torch is used as the flame source. The torch, when applied to the quartz batting alone, would pucker and finally melt the batting. The MAPP gas torch is used to similar effect with Blanket #2. If the torch nozzle is placed close to Blanket #2, eventual degradation/sintering and burn-through occurs. The short carbon fiber augmented aerogel batting of this Example shows no degradation other than on the very bottom surface. It can not be burned through using the MAPP gas torch. The top of the sample can be touched with a bare hand during the test. The bottom of the blanket glows orange-yellow-white depending on how far away the torch is placed. Aerogel sintering appears minimal. The combination of macro and micro fiber reinforcement works far better than the macro fiber reinforcement alone.

EXAMPLE 7

Figure 7:
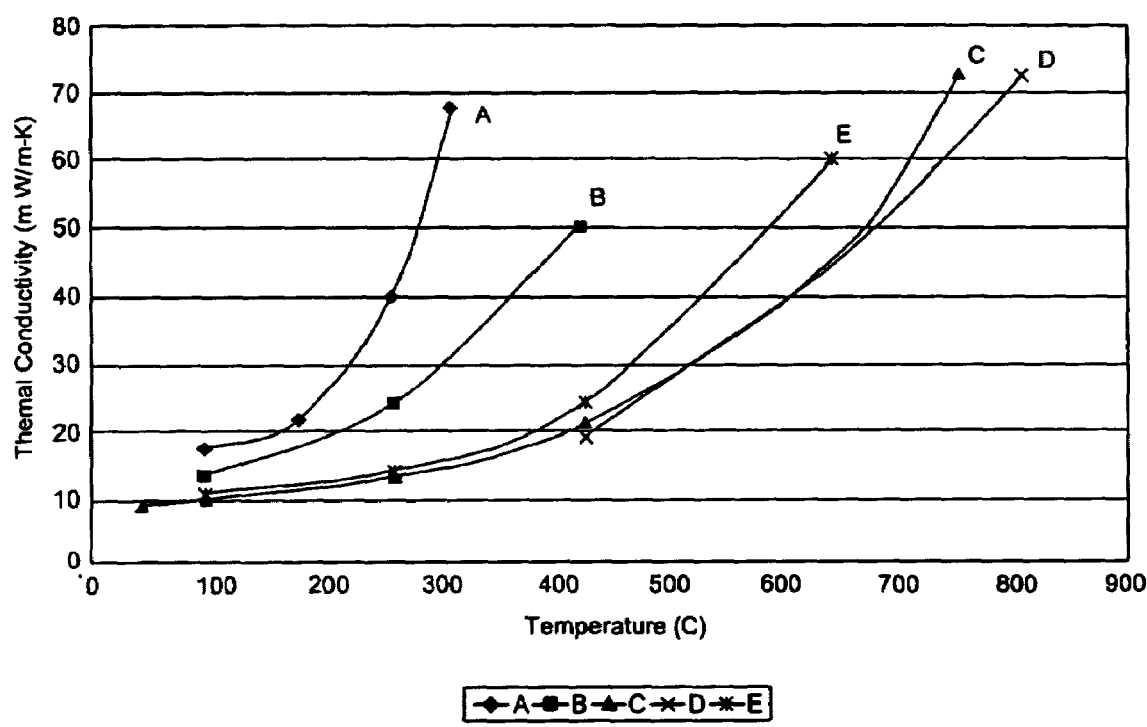
FIG. 7 is a graph of the thermal conductivity of five manufactured aerogel composites of this invention through a range of temperatures.

To evaluate the effects of various reinforcing systems on aerogel composites of one or more embodiments of the present invention, a series of composites was prepared in accordance with the procedure of Example 1 but varying the reinforcements. The aerogel composites are prepared by infiltrating a lofty reinforcement with an appropriate sol followed by supercritical drying. FIG. 7 shows the results of thermal performance vs. temperature for the following samples:

Sample A used a less than 2 denier lofty polyester batting where the cross-sectional area of fibers was less than 15% of the total cross-sectional area of the aerogel composite, and where after compression the lofty batting returned to 75% of its original thickness.

Sample B used quartz wool prepared from 9 µm fibers, with a batting density of 0.005 g/cc, and where after compression the lofty batting returned to 75% of its original thickness.

Sample C used the batting of Sample B, in combination with 5% by weight based upon the total weight of the dried composite carbon black dopant and 3% (same basis) carbon microfiber. The carbon black was Cabot Vulcan carbon black. The carbon microfibers were 0.1 to 100 µm diameter and approximately 1–2 mm in length. Disperbyk 184 dispersant was used.

Sample D used the batting of Sample B, in combination with 6% by weight based upon the total weight of the dried composite carbon black dopant and 4% (same basis) carbon microfiber. The carbon black was Cabot Vulcan carbon black. The carbon microfibers were 0.1 to 100 µm diameter and approximately 1–2 mm in length. Disperbyk 184 dispersant was used.

Sample E used the batting of Sample B, in combination with 6% by weight based upon the total weight of the dried composite carbon black dopant, 4% (same basis) carbon microfiber, and 10% by weight polydimethylsiloxane dopant. The carbon black was Cabot Vulcan carbon black. The carbon microfibers were 0.1 to 100 µm diameter and approximately 1–2 mm in length. Disperbyk 184 dispersant was used.

Sample E has survived more than 100,000 flexure cycles wherein the material was doubled over upon itself without loss of thermal performance.

What is claimed is:

1. A composite article to serve as a flexible, durable, light-weight insulation product, said article comprising a lofty fibrous batting sheet and a continuous aerogel through said batting.

2. The composite article of claim 1, wherein the aerogel is selected from the group consisting of inorganic gel forming materials.

3. The composite article of claim 1, wherein the inorganic gel forming material is selected from the group consisting of zirconia, yttria, hafnia, alumina, titania, ceria, and silica, and any combination thereof.

4. The composite article of claim 1, wherein the organic gel forming material is selected from the group consisting of polyacrylates, polystyrenes, polyacrylonitriles, polyurethanes, polyimides, polyfurfural alcohol, phenol furfuryl alcohol, melamine formaldehydes, resorcinol formaldehydes, cresol formaldehyde, phenol formaldehyde, polyvinyl alcohol dialdehyde, polycyanurates, polyacrylamides, various epoxies, agar, and agarose, and combination thereof.

5. The composite article of claim 1, wherein the lofty fibrous batting consists essentially of fibers having a thermal conductivity less than 50 mW/m-K.

6. The composite article of claim 1, wherein the lofty batting has a sufficient quantity of fibers in its z axis to provide loft yet not so many that the insulating properties of the composite are compromised by the z axis fibers acting as thermal conduits.

7. The composite article of claim 1, further comprising a dopant.

8. The composite article of claim 7, wherein the dopant is selected from the group consisting of carbon black, titania, iron oxides, silicon carbide, molybdenum silicide, manganese oxides, and polydialkylsiloxanes wherein the alkyl groups contain 1 to 4 carbon atoms.

9. The composite article of claim 7, wherein the dopant is present in an amount of about 1 to 20% by weight of the total weight of the composite.

10. The composite article of claim 1, wherein the surface area of the fibers of the batting visible in a cross-section of the composite is less than 8% of the total surface area of that cross section.

11. The composite article of claim 1, wherein the fibers making up the lofty fibrous batting have a diameter of about 0.1 to 100 μm and are crimped fibers evenly dispersed throughout the composite.

12. A composite article comprising a fibrous batting sheet and a continuous aerogel through said batting, where the batting is sufficiently lofty that the cross-sectional area of the fibers of the batting visible in the cross-section of the composite is less than 10% of the total surface area of that cross section.

13. The composite article of claim 12, wherein the aerogel is selected from the group consisting of inorganic and organic gel forming materials.

14. The composite article of claim 12, wherein the inorganic gel forming material is selected from the group consisting of zirconia, yttria, hafnia, alumina, titania, ceria, and silica, and any combination thereof.

15. The composite article of claim 12, wherein the batting is compressible by a minimum of 50% of its thickness and is sufficiently resilient that after compression for about 5 seconds it returns to at least 70% of its original thickness.

16. The composite article of claim 12, wherein the fibrous batting is sufficiently lofty that it retains at least 50% of its thickness after addition of the gel forming liquid to form said aerogel.

17. The composite article of claim 12, wherein the batting has a density in the range of about 0.1 to 16 lbs/ft$^3$ (0.001–0.4 g/cc), is compressible by at least 65% of its thickness and is sufficiently resilient that after compression for about 5 seconds it returns to at least 75% of its original thickness.

18. The composite article of claim 12, wherein the batting has a density of about 2.44 to 6.1 lbs/ft$^3$ (0.04 to 0.1 g/cc).

19. An aerogel composite article comprising (i) a fibrous batting sheet and a continuous aerogel through said batting, where the batting causes no substantial degradation of the thermal performance of the composite as compared with an aerogel of the same material and (ii) microfibers having diameters from about 0.1 to 100 μm and aspect ratios greater than 5.

20. The composite article of claim 19, wherein the microfibers are comprised of a material having a thermal conductivity below about 200 mW/mK.

21. The composite article of claim 19, wherein the microfibers are comprised of a material that resists sintering more than the lofty fibrous batting.

22. The composite article of claim 19, wherein the microfibers are comprised of a material that reduces the transmission of infrared radiation through the composite more than the lofty fibrous batting.

23. The composite article of claim 19, wherein the microfibers are comprised of a material that attenuates radio frequency waves.

24. The composite article of claim 19, wherein the microfibers are comprised of one or more materials that attenuate electromagnetic waves.

25. The composite article of claim 19, wherein the microfibers are selected from the group consisting of carbon fibers and copper fibers.

26. The composite article of claim 19, wherein at least one of the following properties varies within spatial locations of the composite: microfiber material; microfiber size; microfiber aspect ratio; and microfiber quantity.

27. The composite article of claim 19, wherein a material having a high thermal conductivity equal to or greater than 1 W/mK is added on the x-y axis of the composite structure in addition to the lofty batting.

28. The composite article of claim 27, wherein the high thermal conductivity material comprises a metal.

29. The composite article of claim 28, wherein the high thermal conductivity material is a metal which is sufficiently malleable to provide conformability to the composite to enable the composite to retain its shape after bending.

30. The composite article of claim 29, wherein the metal is selected from the group consisting of copper and steel.

31. The composite article of claim 27, wherein the high thermal conductivity material is in a porous form selected from the group consisting of mesh, sheet, perforated sheet, foil, and perforated foil.

32. The composite article of claim 27, wherein the composite has an x-y horizontal plane and a z vertical plane and the thermally conductive materials are oriented in the x-y plane of the composite.

33. The composite article of claim 27, wherein the high thermal conductivity material conducts heat away from a localized heat load and emits it to the environment.

34. The composite article of claim 33 further comprising a heat sink, wherein the heat is emitted to the environment by means of the heat sink.

35. The composite article of claim 27, wherein the high thermal conductivity material conducts heat away from a localized heat load to a process which uses the thermal energy directly.

36. The composite article of claim 27 further comprising device which converts the thermal energy to electrical energy, wherein the high thermal conductivity material conducts heal away from a localized heat load and into the device.

37. The composite article of claim 27, wherein the high thermal conductivity material comprises carbon fibers.

38. An aerogel composite article comprising (i) a fibrous batting sheet and a continuous aerogel through said batting, where the batting causes no substantial degradation of the thermal performance of the composite as compared with an aerogel of the same material and (ii) one or more high thermal conductivity materials having a thermal conductivity of equal to or greater than 1 W/mK.

39. The composite article of claim 38, wherein the high thermal conductivity material comprises a metal.

40. The composite article of claim 38, wherein the high thermal conductivity material is a metal which is sufficiently malleable to provide conformability to the composite to enable the composite to retain its shape after bending.

41. The composite article of claim 40, wherein the metal is selected from the group consisting of copper and steel.

42. The composite article of claim 38, wherein the high thermal conductivity material is in a porous form selected from the group consisting of mesh, sheet, perforated sheet, foil, and perforated foil.

43. The composite article of claim 38, wherein the composite has an x-y horizontal plane and a z vertical plane and the high thermal conductivity material is oriented in the x-y plane of the composite.

44. The composite article of claim 38, wherein the high thermal conductivity material conducts heat away from a localized heat load and emits it to the environment.

45. The composite article of claim 44, wherein the heat is emitted to the environment by means of a heat sink.

46. The composite article of claim 38, wherein the high thermal conductivity material conducts heat away from a localized heat load to a process which uses the thermal energy directly.

47. The composite article of claim 38, wherein the high thermal conductivity material conducts heat away from a localized heat load and into a device which converts the thermal energy to electrical energy.

48. The composite article of claim 38, wherein the high thermal conductivity material comprises carbon fibers.

49. The composite article of claim 1, wherein the batting has a density of between about 0.001 and 0.26 g/cc.

50. The composite article of claim 1, wherein the batting has a density of between 0.04 and 0.1 g/cc.

51. The composite article of claim 1, wherein the batting has a density of about 0.04.

\* \* \* \* \*

UNITED STATES PATENT AND TRADEMARK OFFICE
CERTIFICATE OF CORRECTION

PATENT NO. : 7,078,359 B2
APPLICATION NO. : 10/034296
DATED : July 18, 2006
INVENTOR(S) : Christopher Stepanian et al.

It is certified that error appears in the above-identified patent and that said Letters Patent is hereby corrected as shown below:

In the Claims, at column 14, lines 41 to 42, claim 2, "inorganic gel forming materials" should be changed to --inorganic and organic gel forming materials--.

In the Claims, at column 14, line 43, claim 3, "claim 1" should be changed to --claim 2--.

In the Claims, at column 14, line 47, claim 4, "claim 1" should be changed to --claim 2--.

In the Claims, at column 16, line 41, claim 36, "heal" should be changed to --heat--.

Signed and Sealed this

Thirteenth Day of January, 2009

JON W. DUDAS
*Director of the United States Patent and Trademark Office*